United States Patent
Kanki et al.

(10) Patent No.: US 10,404,237 B2
(45) Date of Patent: Sep. 3, 2019

(54) FLUCTUATION OSCILLATOR, SIGNAL DETECTION DEVICE, AND DISPLAY DEVICE

(71) Applicants: OSAKA UNIVERSITY, Osaka (JP); UNIVERSITY OF HYOGO, Hyogo (JP)

(72) Inventors: Teruo Kanki, Osaka (JP); Kosuke Kato, Osaka (JP); Yasushi Hotta, Hyogo (JP)

(73) Assignees: OSAKA UNIVERSITY, Osaka (JP); UNIVERSITY OF HYOGO, Hyogo (JP)

( * ) Notice: Subject to any disclaimer, the term of this patent is extended or adjusted under 35 U.S.C. 154(b) by 0 days.

(21) Appl. No.: 15/755,248

(22) PCT Filed: Aug. 24, 2016

(86) PCT No.: PCT/JP2016/074623
§ 371 (c)(1),
(2) Date: Feb. 26, 2018

(87) PCT Pub. No.: WO2017/033962
PCT Pub. Date: Mar. 2, 2017

(65) Prior Publication Data
US 2018/0254770 A1 Sep. 6, 2018

(30) Foreign Application Priority Data

Aug. 27, 2015 (JP) .................................. 2015-167624

(51) Int. Cl.
*H03K 3/0231* (2006.01)
*H03K 3/84* (2006.01)
(Continued)

(52) U.S. Cl.
CPC ............. *H03K 3/0231* (2013.01); *G06G 7/14* (2013.01); *G06G 7/18* (2013.01); *H03K 3/84* (2013.01)

(58) Field of Classification Search
CPC ...... H03B 2200/0088; H03B 2200/009; H03B 2200/0092; H03K 3/0231; H03K 3/84
(Continued)

(56) References Cited

U.S. PATENT DOCUMENTS 3,304,515 A * 2/1967 Stieler ...................... G01S 1/02
327/164
7,385,443 B1 * 6/2008 Denison .................... H03F 3/38
330/10
(Continued)

FOREIGN PATENT DOCUMENTS

JP 55-61113 5/1980
JP 2001-111356 4/2001
(Continued)

OTHER PUBLICATIONS

International Search Report dated Nov. 1, 2016 in International (PCT) Application No. PCT/JP2016/074623.
(Continued)

*Primary Examiner* — Levi Gannon
(74) *Attorney, Agent, or Firm* — Wenderoth, Lind & Ponack, L.L.P.

(57) ABSTRACT

An adder adds a noise signal, an input signal, and a feedback signal. A threshold determination unit compares an addition signal output from the adder with a predetermined threshold, and outputs an ignition pulse signal. A transient response unit causes transient response of the ignition pulse signal, and generates an output signal. An intensity adjustment unit
(Continued)

is formed of a variable resistor provided on a feedback loop, adjusts intensity of the feedback signal, and inputs the feedback signal to the adder.

10 Claims, 16 Drawing Sheets

(51) Int. Cl.
  *G06G 7/14* (2006.01)
  *G06G 7/18* (2006.01)

(58) Field of Classification Search
  USPC .......................................................... 331/78
  See application file for complete search history.

(56) References Cited

U.S. PATENT DOCUMENTS

| | | |
|---|---|---|
| 2011/0068875 A1 | 3/2011 | Hotta et al. |
| 2014/0270261 A1* | 9/2014 | Wiesbauer ............ H03M 1/60 381/111 |
| 2016/0211110 A1 | 7/2016 | Kanai et al. |

FOREIGN PATENT DOCUMENTS

| | | |
|---|---|---|
| JP | 2002-221546 | 8/2002 |
| JP | 2003-228330 | 8/2003 |
| JP | 2004-125433 | 4/2004 |
| JP | 4875161 | 12/2011 |
| WO | 2009/025327 | 2/2009 |
| WO | 2010/035576 | 4/2010 |
| WO | 2015/029542 | 3/2015 |

OTHER PUBLICATIONS

Yasushi Hotta et al., "Cooperative Dynamics of an Artificial Stochastic Resonant System", Applied Physics Express 1, 2008.
Extended European Search Report dated Aug. 6, 2018 in European Application No. 16839309.8.
Shi et al., "A High-resolution Weak Signal Detection Method Based on Stochastic Resonance and Superhet Technology", 7th International ICST Conference on Communications and Networking in China (CHINACOM), pp. 329-333 (2012).
Dai et al., "An Improved Bistable Circuitry System for Weak Signal Detection", Proceeding of the IEEE International Conference on Information and Automation, pp. 79-84 (2011).
Bulsara et al., "Logical stochastic resonance", Chemical Physics, 375(2-3):424-434 (2010).
Notice of Reasons for Refusal dated Jun. 4, 2019 in Japanese Patent Application No. 2017-536458.

* cited by examiner

FLUCTUATION OSCILLATOR, SIGNAL DETECTION DEVICE, AND DISPLAY DEVICE

TECHNICAL FIELD

The present invention relates to a fluctuation oscillator that oscillates by providing an input signal with fluctuation, and a signal detection device and a display device including the fluctuation oscillator.

BACKGROUND ART

Oscillators such as a crystal oscillator, a Hartley oscillator, a Clapp oscillator, and an astable multivibrator have been conventionally known. Since such a conventional oscillator is vulnerable to noise, countermeasures against noise are required. Therefore, a fluctuation oscillator including a stochastic resonator is known as an oscillator robust against noise.

For example, Patent Literature 1 discloses a fluctuation oscillator in which a plurality of stochastic resonators is connected in a ring shape. Also, Patent Literature 1 discloses a fluctuation oscillator in which a feedback loop is provided between input and output terminals of one stochastic resonator.

However, since the fluctuation oscillator disclosed in Patent Literature 1 is based on the premise that a plurality of stochastic resonators is provided, there is a problem that costs will increase.

In addition, the fluctuation oscillator has a property of oscillating in synchronization with an input signal. Therefore, by causing the fluctuation oscillator to oscillate in synchronization with a weak unknown input signal and monitoring an output signal from the fluctuation oscillator, it is possible to detect characteristics of this input signal (for example, frequency). Here, in order to cause the fluctuation oscillator to oscillate in synchronization with the weak unknown input signal, it is necessary to adjust a circuit parameter of the fluctuation oscillator to an appropriate value. However, since the fluctuation oscillator disclosed in Patent Literature 1 includes a plurality of stochastic resonators, there is a problem that it is necessary to individually adjust parameters of the stochastic resonators and it takes time and effort to adjust the parameters.

In addition, although Patent Literature 1 discloses a fluctuation oscillator in which a feedback loop is provided between input and output terminals of one stochastic resonator, adjustment of intensity of a signal flowing through the feedback loop is not taken into consideration at all. Therefore, the fluctuation oscillator disclosed in Patent Literature 1 has a problem that the circuit parameters cannot be flexibly adjusted and that it is difficult to cause the fluctuation oscillator to oscillate such that the unknown weak input signal can be detected.

CITATION LIST

Patent Literature

Patent Literature 1: Japanese Patent No. 4875161

SUMMARY OF INVENTION

An object of the present invention is to provide a fluctuation oscillator that allows flexible adjustment of the circuit parameters, and a signal detection device and a display device including the fluctuation oscillator.

A fluctuation oscillator according to one aspect of the present invention includes:
- an adder configured to add a noise signal and a feedback signal to an input signal;
- a threshold determination unit configured to generate a pulse signal by comparing an addition signal obtained through the addition with a threshold;
- a transient response unit configured to cause transient response of the generated pulse signal to generate an output signal;
- a feedback loop configured to feed back the output signal to the adder as the feedback signal; and
- an intensity adjustment unit provided in the feedback loop and configured to adjust intensity of the feedback signal.

According to the present invention, since the intensity adjustment unit for adjusting the intensity of the feedback signal is provided on the feedback loop, adjustment of the circuit parameter for causing the fluctuation oscillator to oscillate becomes easy. As a result, it becomes easy to adjust the circuit parameter of the fluctuation oscillator so as to detect the unknown weak input signal, and it becomes easy to detect the unknown weak input signal.

DESCRIPTION OF EMBODIMENTS

First Embodiment

Figure 1:
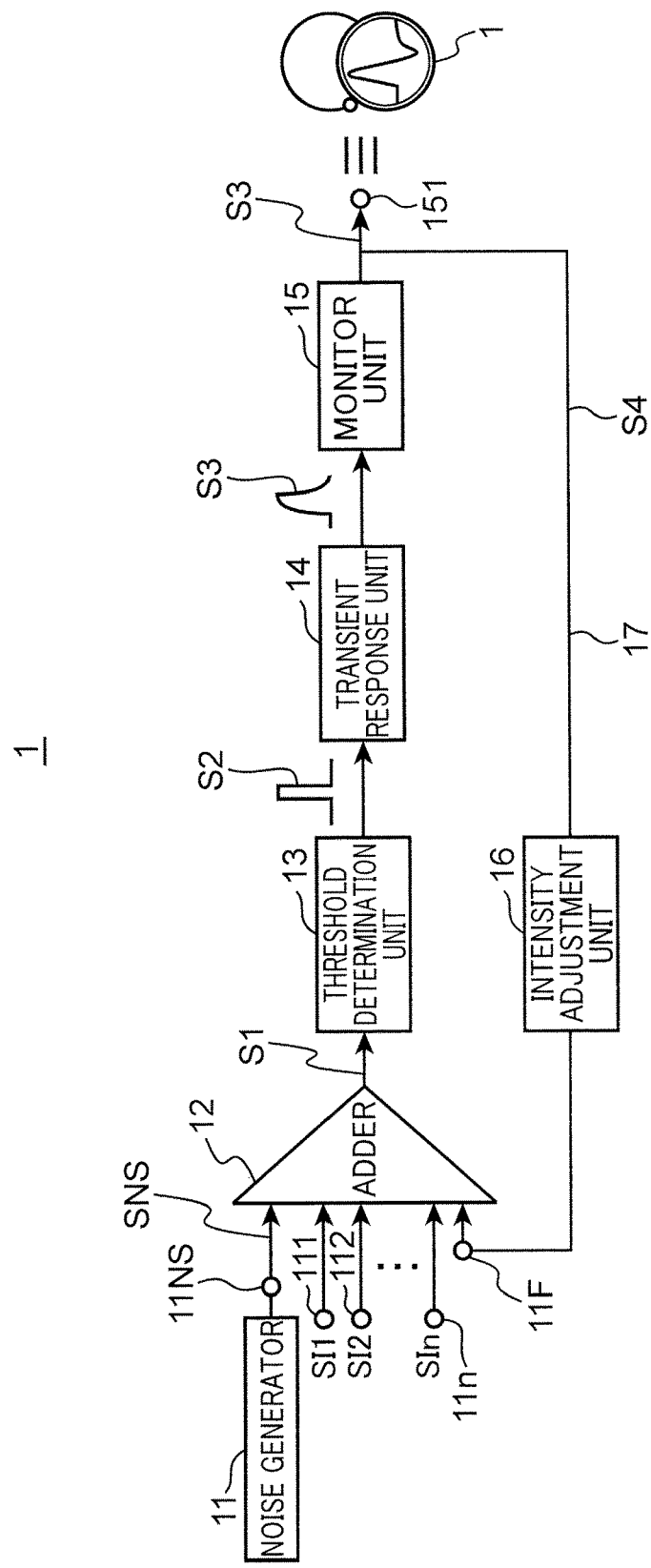
FIG. 1 is a diagram illustrating one example of a configuration of a fluctuation oscillator according to a first embodiment of the present invention.

FIG. 1 is a diagram illustrating one example of a configuration of a fluctuation oscillator 1 according to a first embodiment of the present invention. As illustrated in FIG. 1, the fluctuation oscillator 1 includes a noise generator 11, an adder 12, a threshold determination unit 13, a transient response unit 14, a monitor unit 15, an intensity adjustment unit 16, and a feedback loop 17. The noise generator 11 includes a function generator that generates various noise signals SNS such as Gaussian white noise and thermal noise, for example.

The adder 12 receives n types of input signals SI1 to SIn (n is a positive integer), the noise signal SNS output from the noise generator 11, and a feedback signal S4 output from the intensity adjustment unit 16. Then, the adder 12 superimposes (adds) the input noise signal SNS, the n types of input signals SI1 to SIn, and the feedback signal S4, and then produces an output to the threshold determination unit 13. In the adder 12, the noise signal is added to the input signals SI1 to SIn, thereby providing the input signals with fluctuation.

Here, the adder 12 includes input terminals 111 to 11n to which n types of input signals SI1 to SIn are input (n is an integer equal to or greater than 2), a noise terminal 11NS to which the noise signal SNS is input, and a feedback terminal 11F to which the feedback signal S4 is input.

For example, when the fluctuation oscillator 1 detects an unknown input signal, the unknown input signal SI1 to be detected is input into the input terminal 111, and the input signals S12 to SIn are not input into the input terminals 112 to 11n. Therefore, the input terminals 112 to 11n may be omitted.

The threshold determination unit 13 compares an addition signal S1 output from the adder 12 with a predetermined threshold. When the addition signal S1 is equal to or larger than the threshold, the threshold determination unit 13 outputs a high-level pulse signal, and when the addition signal S1 is less than the threshold, the threshold determination unit 13 outputs a low-level pulse signal. Hereinafter, the pulse signal output by the threshold determination unit 13 is described as an ignition pulse signal S2 following ignition of a neuron. Also, when the ignition pulse signal S2 is a high level, it is described that the fluctuation oscillator 1 is ignited.

Here, the threshold has hysteresis, and a value of the threshold when the ignition pulse signal S2 changes from a low level to a high level differs from a value of the threshold when the ignition pulse signal S2 changes from a high level to a low level. Providing the threshold with hysteresis can be easily achieved by the threshold determination unit 13 including, for example, a Schmitt trigger circuit.

The transient response unit 14 includes, for example, an integrator or a differentiator, causes transient response of the ignition pulse signal S2 output from the threshold determination unit 13, and generates a transient response signal of the ignition pulse signal S2 as an output signal S3.

The monitor unit 15 monitors the output signal S3. In the present embodiment, the monitor unit 15 includes, for example, an information processing device such as a computer, and displays a waveform of the output signal S3 on a display, and detects a frequency of the output signal S3 and displays the frequency on the display. Thus, an operator can detect the input signal from information displayed on the display.

The intensity adjustment unit 16 includes a variable resistor provided on the feedback loop 17, and adjusts intensity of the feedback signal S4 and inputs the feedback signal S4 into the adder 12.

The feedback loop 17 includes a line provided between an output terminal 151 and the feedback terminal 11F, and feeds back the output signal S3 to the adder 12 as the feedback signal S4.

The output terminal 151 is provided on an output side of the monitor unit 15 and outputs the output signal S3 to the outside.

In the present embodiment, the fluctuation oscillator 1 indicated on a left side of FIG. 1 is represented by using a symbol on a right side of FIG. 1. Also, in FIG. 1, the fluctuation oscillator 1 includes the monitor unit 15, but the monitor unit 15 may be omitted. In this case, the feedback loop 17 can be connected between an output side of the transient response unit 14 and the feedback terminal 11F.

Figure 2:
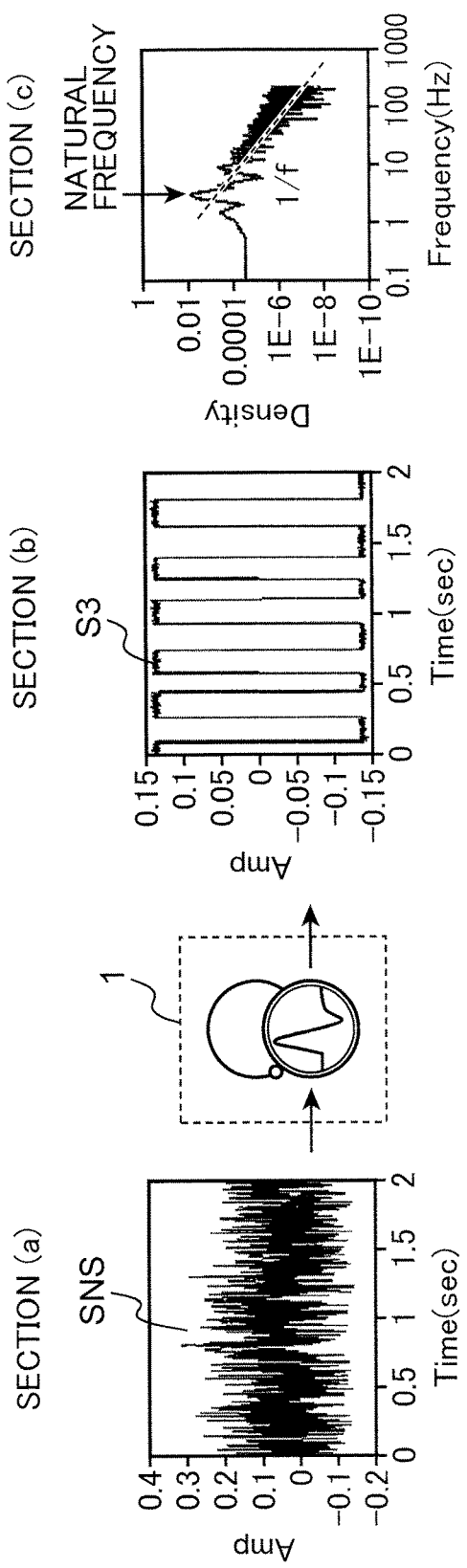
FIG. 2 is waveform diagrams of signals flowing through the fluctuation oscillator.

FIG. 2 is waveform diagrams of signals flowing through the fluctuation oscillator 1. Section (a) is a waveform diagram of the noise signal SNS. Section (b) is a waveform diagram of the output signal S3. Section (c) is a power spectrum of the output signal S3.

When section (a) is observed, the noise signal SNS is a signal with amplitude varied randomly. When such a noise signal SNS is input into the fluctuation oscillator 1, the output signal S3 as illustrated in section (b) is output from the fluctuation oscillator 1. Here, when the waveform of the output signal S3 is observed, it is seen that the output signal S3 varies periodically. Therefore, when the noise signal SNS is input into the fluctuation oscillator 1, it can be confirmed that the fluctuation oscillator 1 oscillates.

In addition, when section (c) is observed, it is seen that in the power spectrum of the output signal S3, intensity decreases at a constant inclination in a region where the frequency is 1 Hz or higher, which is a natural frequency of the fluctuation oscillator 1, and that the power spectrum has characteristics of 1/f fluctuation. Therefore, when a light emitting device is caused to emit light by using the output signal S3, the light emitting device can emit light in a light emitting pattern comfortable for a human. Alternatively, when an actuator is driven using the output signal S3, an object to be controlled operated by the actuator can be operated as if the object seems to be moving autonomously.

Figure 3:
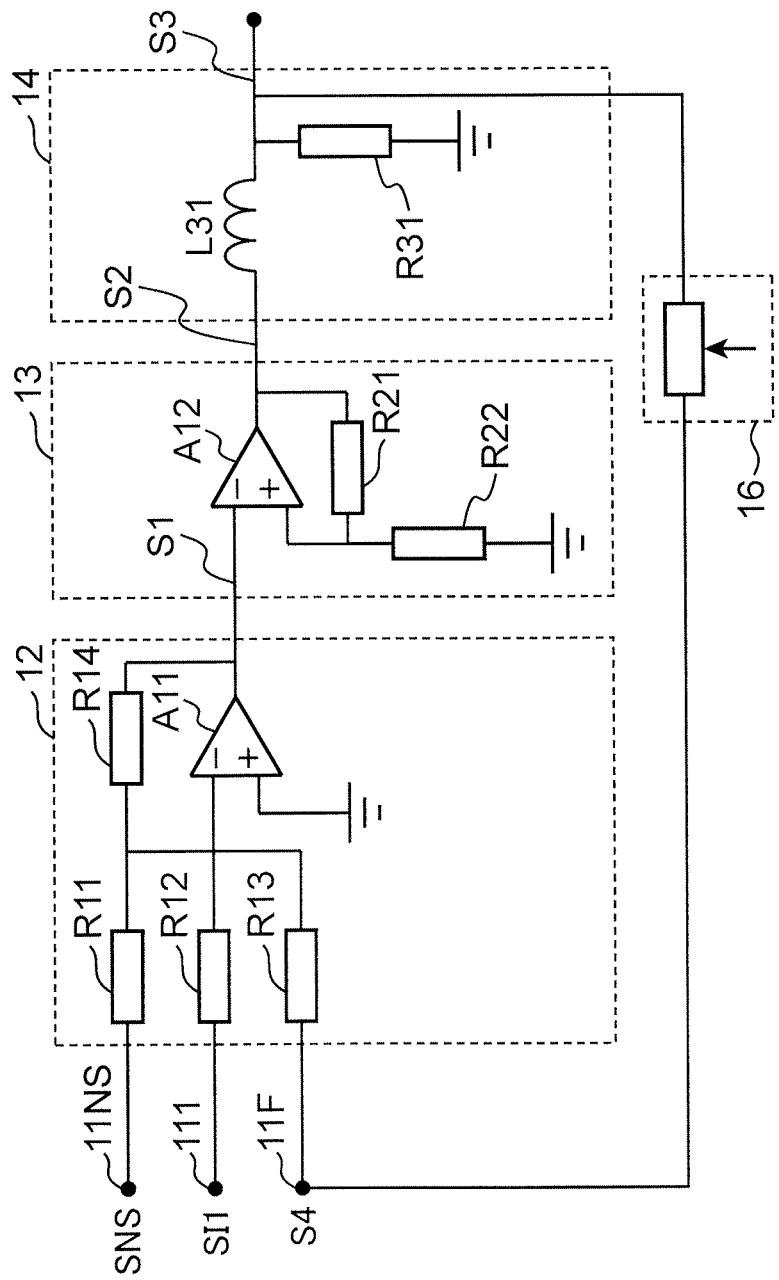
FIG. 3 is a diagram illustrating one example of a detailed circuit configuration of the fluctuation oscillator illustrated in FIG. 1.

FIG. 3 is a diagram illustrating one example of a detailed circuit configuration of the fluctuation oscillator 1 illustrated in FIG. 1. Note that in FIG. 3, illustration of the monitor unit 15 is omitted. The adder 12 includes a mixer circuit including an operational amplifier A11 with a plus input terminal grounded, resistors R11, R12, and R13 connected to a minus input terminal of the operational amplifier A11, and a resistor R14 provided between the minus input terminal and an output terminal of the operational amplifier A11. Then, the adder 12 adds the noise signal SNS input into the noise terminal 11NS, the input signal SI1 input into the input terminal 111, and a feedback signal S4 input into the feedback terminal 11F.

The threshold determination unit 13 includes a Schmitt trigger circuit including an operational amplifier A12 and resistors R21 and R22. A plus input terminal of the operational amplifier A12 is grounded via the resistor R22. Also, in the operational amplifier A12, an output terminal and the plus input terminal are connected to each other via the resistor R21. Also, in the operational amplifier A12, a minus input terminal is connected to the output terminal of the operational amplifier A11.

The transient response unit 14 includes an integrator including a coil L31 with one end connected to the output terminal of the operational amplifier A12 and a resistor R31 with one end connected to the other end of the coil L31 and the other end grounded.

The intensity adjustment unit 16 includes, for example, an adjustment knob (not illustrated) or a variable resistor with a resistance value that can be changed by a control signal.

Note that in FIG. 3, the transient response unit 14 includes an integrator, but is not limited to this configuration, and may include a differentiator.

Figure 4:
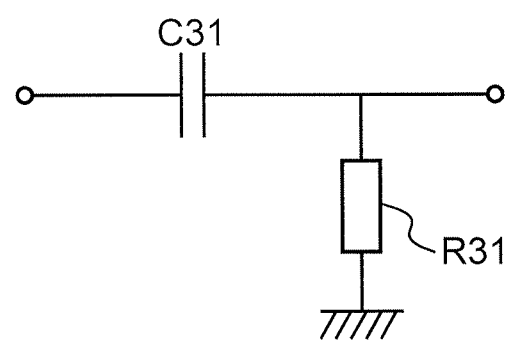
FIG. 4 is a circuit diagram of a transient response unit including a differentiator.

FIG. 4 is a circuit diagram of the transient response unit 14 including a differentiator. The transient response unit 14 includes a capacitor C31 and the resistor R31. The transient response unit 14 of FIG. 4 has the same configuration as the transient response unit 14 of FIG. 3 except that the coil L31 is replaced with the capacitor C31 in the transient response unit 14 of FIG. 3.

Figure 5:
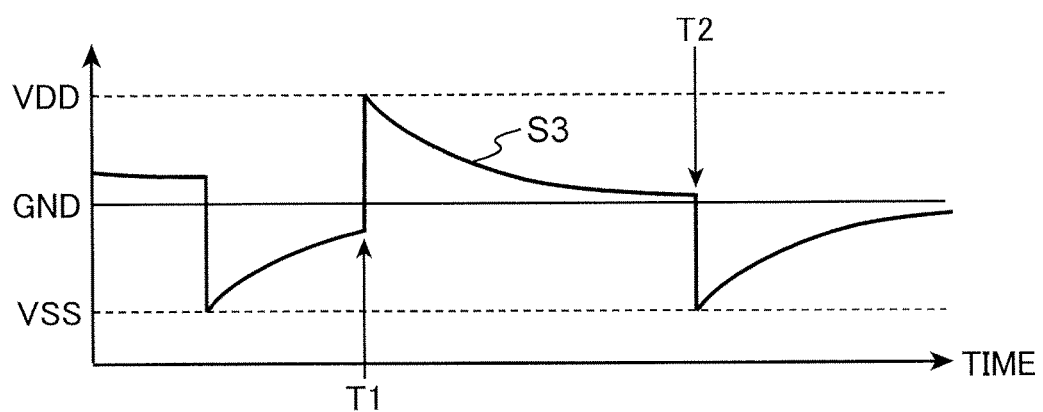
FIG. 5 is a waveform diagram of an output signal in a case where the transient response unit includes the differentiator illustrated in FIG. 4.

FIG. 5 is a waveform diagram of the output signal S3 in a case where the transient response unit 14 includes the differentiator illustrated in FIG. 4. Note that in FIG. 5, a vertical axis represents a voltage and a horizontal axis represents time. At a time T1, the addition signal S1 exceeds a threshold and the ignition pulse signal S2 becomes a high level. Therefore, the output signal S3 rises to a positive side power supply voltage VDD at once, and thereafter is attenuated toward a ground level GND in accordance with a time constant of the differentiator.

At a time T2, the addition signal S1 becomes lower than the threshold, and the ignition pulse signal S2 becomes a low level. Therefore, the output signal S3 falls at once to a negative side power supply voltage VSS, and thereafter increases in accordance with the time constant of the differentiator. Thereafter, the fluctuation oscillator 1 oscillates by repeating this behavior.

Figure 6:
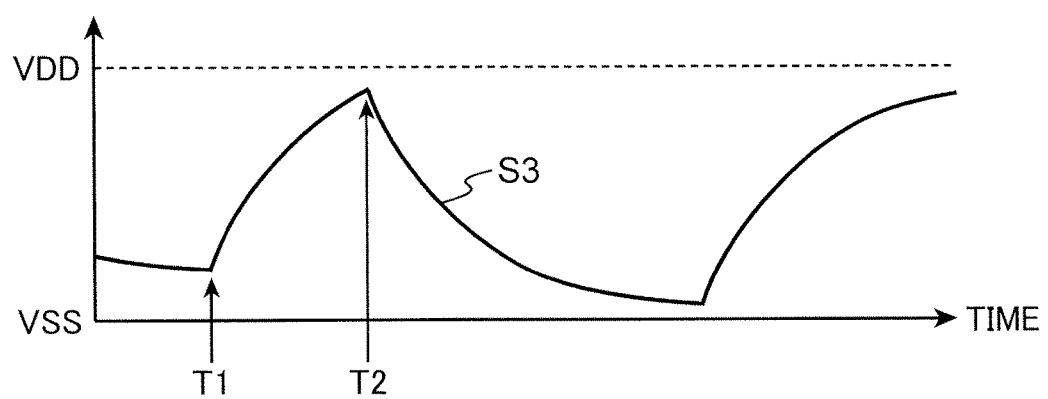
FIG. 6 is a waveform diagram of the output signal in a case where the transient response unit includes an integrator.

FIG. 6 is a waveform diagram of the output signal S3 in a case where the transient response unit 14 includes an integrator. Note that in FIG. 6, a vertical axis represents a voltage and a horizontal axis represents time. At a time T1, the addition signal S1 exceeds a threshold and the ignition pulse signal S2 becomes a high level. Therefore, the output signal S3 increases in accordance with a time constant of the integrator.

At a time T2, the addition signal S1 becomes lower than the threshold, and the ignition pulse signal S2 becomes a low level. Therefore, the output signal S3 is attenuated in accordance with the time constant of the integrator. Thereafter, the fluctuation oscillator 1 oscillates by repeating this behavior.

As illustrated in FIG. 6, the integrator can vary the output signal S3 more smoothly than the differentiator can. Therefore, when it is desired to cause the light emitting device to emit light in a smooth light emission pattern or when it is desired to operate an object to be controlled in a smooth operation pattern, it is preferable to employ the integrator as the transient response unit 14. Meanwhile, when it is desired to cause the light emitting device to emit light in a light emission pattern in which light control changes rapidly, or when it is desired to operate an object to be controlled in an operation pattern in which the operation changes rapidly, it is preferable to employ the differentiator as the transient response unit 14.

Figure 7:
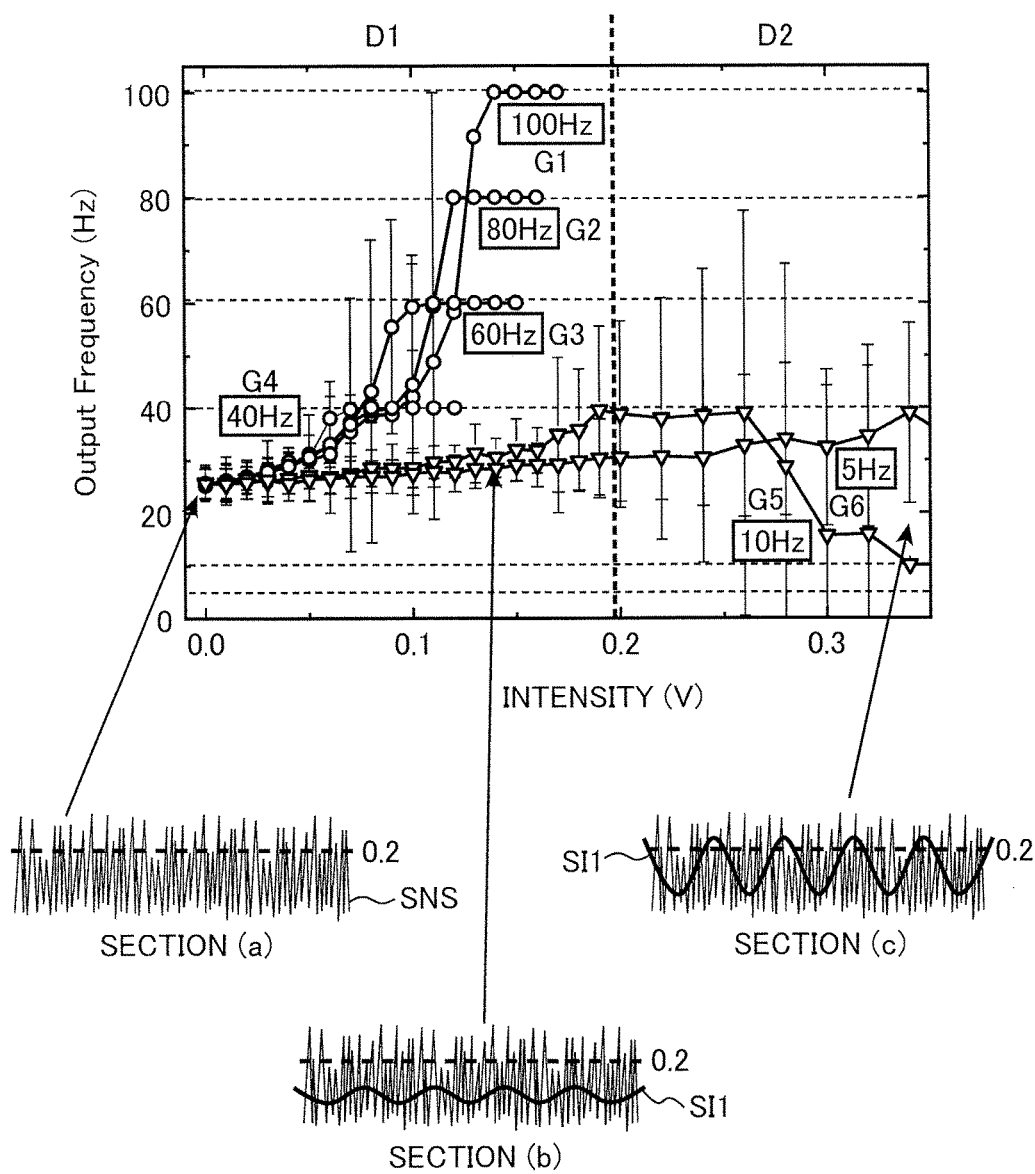
FIG. 7 is a graph illustrating a relationship between a frequency of the output signal and intensity of an input signal in the fluctuation oscillator.

FIG. 7 is a graph illustrating a relationship between the frequency of the output signal S3 and intensity of the input signal SI1 in the fluctuation oscillator 1. In FIG. 7, a vertical axis represents the frequency of the output signal S3, and a horizontal axis represents the intensity of the input signal SI1. The intensity of the input signal SI1 refers to the largest value of the input signal.

Note that in FIG. 7, the threshold for the transient response unit 14 is set at "0.2 V". Also, in FIG. 7, the natural frequency of the fluctuation oscillator 1 is set at "25 Hz". As illustrated in section (a), the natural frequency refers to an oscillation frequency of the fluctuation oscillator 1 when only the noise signal SNS is input to cause the fluctuation oscillator 1 to oscillate.

Also, in FIG. 7, a first threshold region D1 refers to a region where the intensity of the input signal SI1 is lower than the threshold "0.2 V" as illustrated in section (b). Also, in FIG. 7, a second threshold region D2 refers to a region where the intensity of the input signal SI1 is higher than the threshold "0.2 V" as illustrated in section (c).

In FIG. 7, graphs G1, G2, G3, G4, G5, and G6 indicate a relationship between the frequency of the output signal S3 and the intensity of the input signal SI1 when the frequencies of the input signal SI1 are 100 Hz, 80 Hz, 60 Hz, 40 Hz, 10 Hz, and 5 Hz, respectively. Note that points plotted in graphs G1 to G6 indicate average values of a plurality of measurement results under the same condition. In addition, line segments extending vertically with respect to the plotted points represent error bars and represent variations in the measurement results. In addition, the frequency can be calculated by sampling the output signal S3 at a constant sampling period and performing Fourier transform.

When graphs G1 to G4 are observed in which the frequency of the input signal SI1 is higher than the natural frequency "25 Hz", it is seen that as the intensity of the input signal SI1 increases, the frequency of the output signal S3 increases. Then, it is seen that, when the frequency of the output signal S3 increases to the frequency of the input signal SI1, even if the intensity of the input signal SI1 increases, the frequency of the output signal S3 does not increase, and widths of the error bars of the frequency of the output signal S3 also converge.

This indicates that the fluctuation oscillator 1 is synchronized with the input signal SI1. For example, in graph G1, when the intensity of the input signal SI1 increases to about "0.14 V", the frequency of the output signal S3 becomes the same as the frequency "100 Hz" of the input signal SI1, and the fluctuation oscillator 1 is synchronized with the input signal SI1.

Meanwhile, when graphs G5 and G6 are observed in which the frequency of the input signal SI1 is lower than the natural frequency "25 Hz", it is seen that, even if the intensity of the input signal SI1 increases, the graphs do not become flat and the widths of the error bars do not converge, and the fluctuation oscillator 1 is not synchronized with the input signal SI1.

As described above, it is seen that, when the frequency of the input signal SI1 is higher than the natural frequency, the fluctuation oscillator 1 can be synchronized with the input signal, whereas when the frequency of the input signal SI1 is lower than the natural frequency, the fluctuation oscillator 1 cannot be synchronized with the input signal.

Therefore, in the present embodiment, circuit parameters of the fluctuation oscillator 1 are adjusted such that the natural frequency becomes lower than the frequency of the input signal SI1 to be detected.

Specifically, in the fluctuation oscillator 1, a time constant of the transient response unit 14 and intensity of the intensity adjustment unit 16 are adjusted such that the natural frequency is lower than the frequency of the assumed input signal SI1 to be detected. Therefore, the fluctuation oscillator 1 can detect the input signal SI1. Note that when the time constant of the transient response unit 14 increases, the waveform of the output signal S3 is distorted, and thus the natural frequency shows a decreasing tendency. Meanwhile, when the intensity of the intensity adjustment unit 16 increases, amplitude of the output signal S3 increases, and thus the natural frequency shows an increasing tendency. Therefore, the natural frequency can be increased by decreasing the time constant of the transient response unit 14 and increasing the intensity of the intensity adjustment unit 16. Also, the natural frequency can be decreased by increasing the time constant of the transient response unit 14 and decreasing the intensity of the intensity adjustment unit 16.

In addition, when graphs G1 to G4 are observed, it is seen that graphs G1 to G4 rise quickly in order of graphs G4, G3, G2, and G1. Therefore, it is seen that, as the frequency of the input signal SI1 is closer to the natural frequency "25 Hz", the graphs rise quicker, and the intensity of the input signal SI1 when synchronizing decreases.

Meanwhile, when graphs G5 and G6 are observed, it is seen that, in a region where none of "40 Hz", "60 Hz", "80 Hz", "100 Hz" is synchronized (hereinafter referred to as "incomplete synchronous region"), as the intensity of the input signal SI1 increases, the frequency of the output signal S3 stays almost flat.

As described above, in the incomplete synchronous region, it is seen that, when the frequency of the input signal SI1 is higher than the natural frequency, a frequency shift amount $\Delta f$ (shift amount of the frequency of the output signal S3 with respect to the natural frequency) is observed, and when the frequency of the input signal SI1 is lower than the natural frequency, the frequency shift amount is not observed.

Therefore, in the incomplete synchronous region, when the frequency shift amount $\Delta f$ is observed, it can be determined that the input signal SI1 having a frequency higher than the natural frequency is input, and when the frequency shift amount $\Delta f$ is not observed, it can be determined that the input signal SI1 having a frequency higher than the natural frequency is not input.

Meanwhile, when the fluctuation oscillator 1 is completely synchronized with the input signal SI1, the frequency of the output signal S3 can be detected as the frequency of the input signal SI1.

Furthermore, since the fluctuation oscillator 1 cannot detect the input signal SI1 having a frequency equal to or lower than the natural frequency, the fluctuation oscillator 1 can have a function of a high-pass filter.

Figure 8:
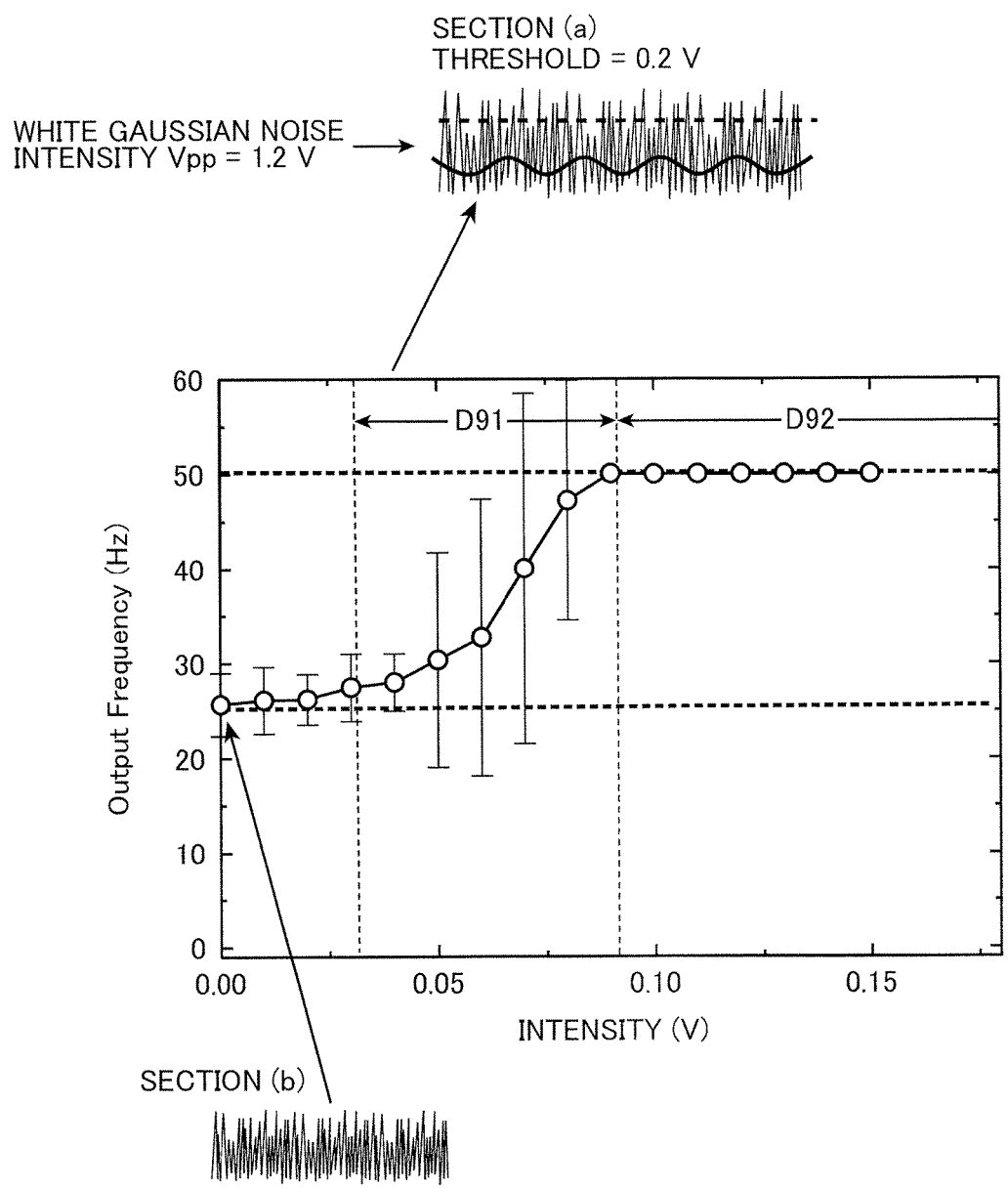
FIG. 8 is a graph illustrating a relationship between the frequency of the output signal and the intensity of the input signal when the input signal with the intensity lower than a threshold is input into the fluctuation oscillator.

FIG. 8 is a graph illustrating a relationship between the frequency of the output signal S3 and the intensity of the input signal SI1 when the input signal SI1 with the intensity lower than the threshold is input into the fluctuation oscillator 1. In FIG. 8, a vertical axis represents the frequency of the output signal S3, whereas a horizontal axis represents the intensity of the input signal SI1. In FIG. 8, as illustrated in section (a), "0.2 V" is employed as the threshold, and as the input signal SI1, a sine wave having an intensity lower than the threshold "0.2 V" and a frequency of 50 Hz is employed. In addition, as the noise signal SNS, white Gaussian noise having an intensity of "1.2 V" is used. In addition, the natural frequency of the fluctuation oscillator 1 is set at 25.6 Hz as illustrated in section (b).

In FIG. 8, a region where the frequency of the input signal SI1 is about 0.03 V to 0.09 V is an incomplete synchronous region D91, and a region where the frequency of the input signal SI1 is about 0.09 V or higher is a complete synchronous region D92. The incomplete synchronous region D91 refers to a region where the fluctuation oscillator 1 oscillates with the frequency varied to some extent. The complete synchronous region D92 refers to a region where the fluctuation oscillator 1 oscillates at a frequency almost the same as the frequency of the input signal SI1 without variation of the frequency. Hereinafter, an oscillation state of the fluctuation oscillator 1 in the incomplete synchronous region D91 is referred to as "incomplete synchronization", and an oscillation state of the fluctuation oscillator 1 in the complete synchronous region. D92 is referred to as "complete synchronization."

As can be seen from FIG. 8, in a similar manner to FIG. 7, in the incomplete synchronous region D91, it is seen that the frequency of the output signal S3 increases as the intensity of the input signal SI1 increases. Meanwhile, in the complete synchronous region D92, since the fluctuation oscillator 1 oscillates in complete synchronization, it is seen that the output signal S3 maintains the constant frequency "50 Hz" even if the intensity of the input signal SI1 increases.

Here, in the complete synchronous region D92, a lower limit value of the intensity of the input signal SI1 is about "0.09 V." Therefore, it is seen that the fluctuation oscillator 1 is completely synchronized with the input signal SI1 at a value equal to or less than half of the threshold "0.2 V." Therefore, in the complete synchronous region D92, the fluctuation oscillator 1 can detect the weak input signal SI1 having an intensity of about 1/13 with respect to the intensity of the noise signal SNS.

Meanwhile, in the incomplete synchronous region D91, the lower limit value of the intensity of the input signal SI1 is about "0.03V." Therefore, in the incomplete synchronous region D91, the fluctuation oscillator 1 can detect the weak input signal SI1 having an intensity of about 1/40 with respect to the intensity of the noise signal SNS.

Figure 9:
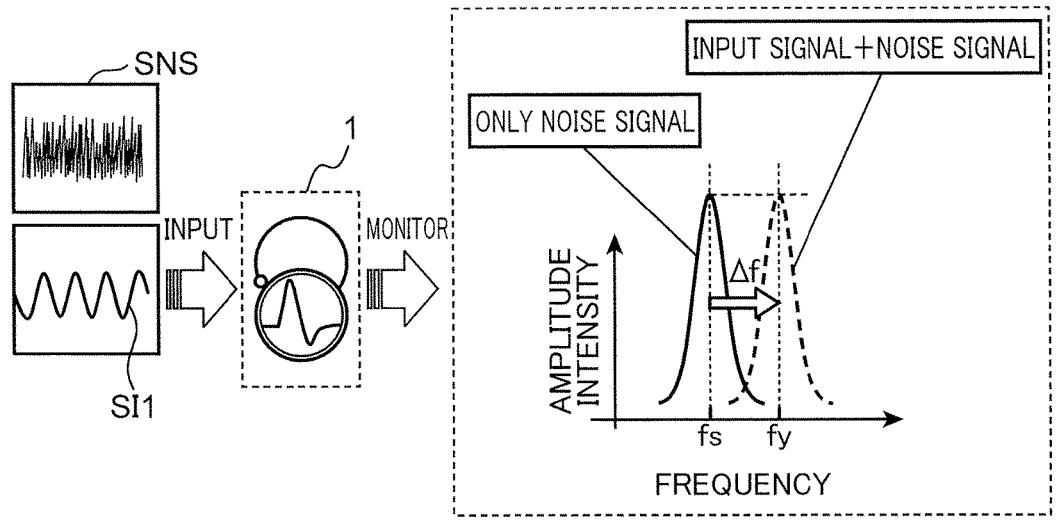
FIG. 9 is a diagram schematically illustrating how the fluctuation oscillator detects the input signal.

FIG. 9 is a diagram schematically illustrating how the fluctuation oscillator 1 detects the input signal SI1. When the noise signal SNS is input into the fluctuation oscillator 1, the fluctuation oscillator 1 oscillates at the natural frequency fs.

When the noise signal SNS and the unknown input signal SI1 are input into the fluctuation oscillator 1, the fluctuation oscillator 1 oscillates at a frequency fy obtained by shifting the frequency from the natural frequency fs by the frequency shift amount $\Delta f$. Here, in the complete synchronous region D92, the frequency fy is the same as the frequency of the input signal SI1. Therefore, by detecting the frequency fy of the output signal S3, the frequency of the input signal SI1 can be detected. Meanwhile, in the incomplete synchronous region D91, when the frequency shift amount $\Delta f$ is observed, the fluctuation oscillator 1 can detect that the input signal SI1 having a frequency equal to or higher than the natural frequency fs is input, whereas when the frequency shift amount $\Delta f$ is not observed, the fluctuation oscillator 1 can detect that the input signal SI1 having a frequency equal to or higher than the natural frequency fs is not input.

Note that the detection of the input signal SI1 described above may be performed by an operator from the waveform of the output signal S3 displayed on the monitor unit 15, or may be automatically performed by the monitor unit 15.

Figure 10:
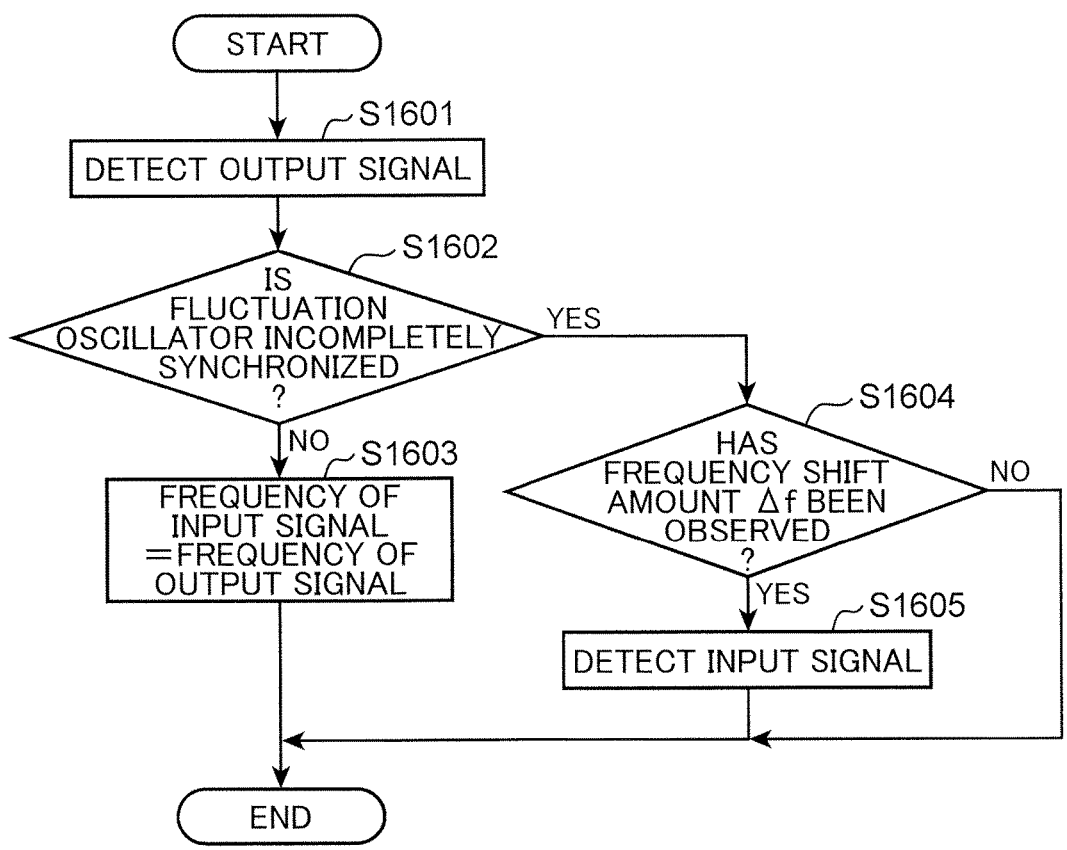
FIG. 10 is a flowchart illustrating one example of a process of a monitor unit when an aspect in which the monitor unit automatically detects the input signal is employed.

FIG. 10 is a flowchart illustrating one example of a process of the monitor unit 15 when an aspect in which the monitor unit 15 automatically detects the input signal SI1 is employed.

First, the monitor unit 15 detects the output signal S3 (S1601). Next, the monitor unit 15 determines whether the fluctuation oscillator 1 is incompletely synchronized or completely synchronized with the input signal SI1. Here, when variation of the frequency of the output signal S3 is within a certain range, the monitor unit 15 may determine that the fluctuation oscillator 1 is completely synchronized with the input signal SI1. When variation of the frequency of the output signal S3 is not within the certain range, the monitor unit 15 may determine that the fluctuation oscillator 1 is incompletely synchronized with the input signal SI1.

Next, when the monitor unit 15 determines that the fluctuation oscillator 1 is not incompletely synchronized, that is, that the fluctuation oscillator 1 is completely synchronized (NO in S1602), the monitor unit 15 determines that the fluctuation oscillator 1 has detected the input signal SI1 having the frequency of the output signal S3 (S1603).

On the other hand, when the monitor unit 15 determines that the fluctuation oscillator 1 is incompletely synchronized with the input signal SI1 (YES in S1602), the monitor unit 15 determines whether the frequency shift amount Δf has been observed (S1604). Here, the monitor unit 15 calculates an average value of the frequency of the output signal S3. When a difference between the calculated average value and the natural frequency is larger than a certain value, the monitor unit 15 may determine that the frequency shift amount Δf has been observed. When the difference between the calculated average value and the natural frequency is equal to or less than the certain value, the monitor unit 15 may determine that the frequency shift amount Δf has not been observed.

Next, when the frequency shift amount Δf has been observed (YES in S1604), the monitor unit 15 determines that the fluctuation oscillator 1 has detected the input signal SI1 having a frequency at least higher than the natural frequency. On the other hand, when the frequency shift amount Δf has not been observed (NO in S1604), the monitor unit 15 may determine that the fluctuation oscillator 1 has not detected the input signal SI1.

Figure 11:
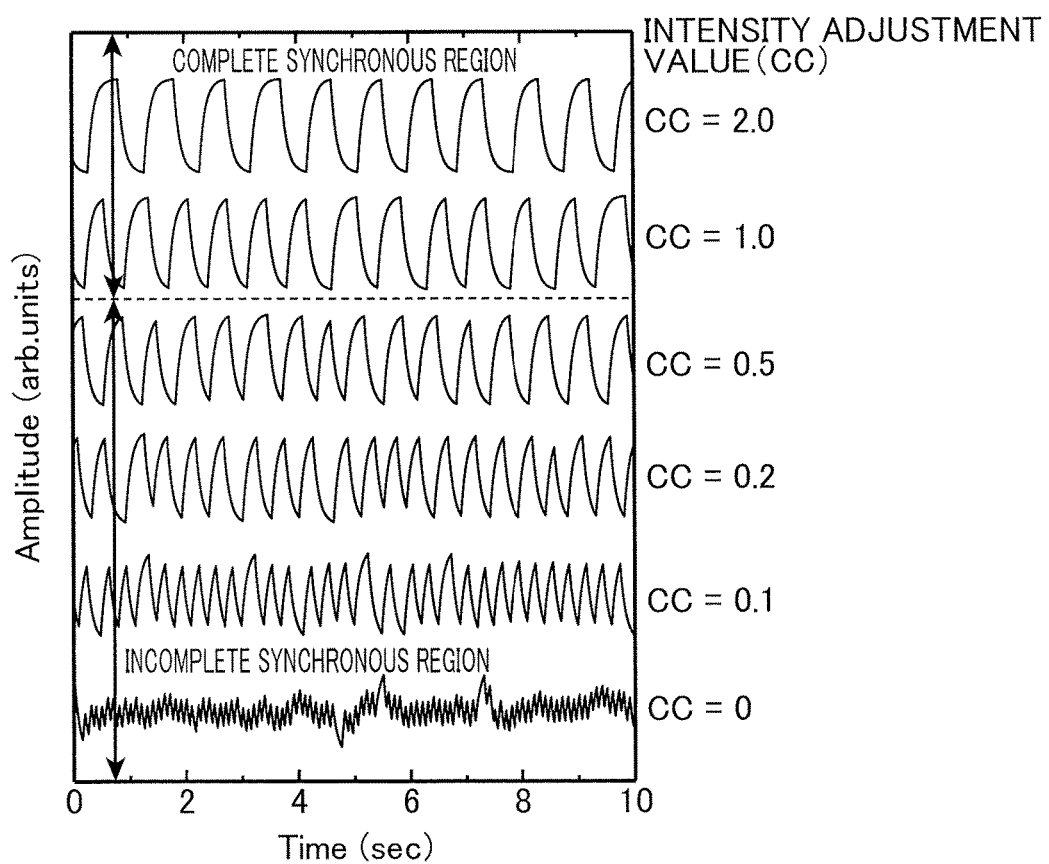
FIG. 11 is one example of the waveform diagram of the output signal according to an intensity adjustment value by an intensity adjustment unit.

FIG. 11 is one example of the waveform diagram of the output signal S3 according to an intensity adjustment value by the intensity adjustment unit 16. A vertical axis represents amplitude of the output signal S3, whereas a horizontal axis represents time. In FIG. 11, "0.2 V" is used as the threshold for the fluctuation oscillator 1, white Gaussian noise with an intensity of "1.5 V" is used as the noise signal SNS, and "1" is used as the time constant of the transient response unit 14. In addition, "0", "0.1", "0.2", "0.5", "1.0", and "2.0" are used as an intensity adjustment value CC of the intensity adjustment unit 16. The intensity adjustment value CC refers to a gain for the feedback signal S4. In addition, a sine wave having a frequency of "1 Hz" and an amplitude of 0.1 V is used as the input signal SI1.

When. FIG. 11 is observed, in a range of the intensity adjustment value CC from 0 to 0.5, it is seen that there are variations in the frequency and the amplitude of the output signal S3, and that the fluctuation oscillator 1 is incompletely synchronized. Meanwhile, when the intensity adjustment value CC exceeds 1.0, there are no variations in the frequency and the amplitude of the output signal S3, and it is seen that the fluctuation oscillator 1 is completely synchronized.

As described above, for example, an operator observes the waveform of the output signal S3 displayed by the monitor unit 15. When the operator determines that the fluctuation oscillator 1 is not completely synchronized with the input signal SI1, by increasing the intensity adjustment value CC, the operator can synchronize the fluctuation oscillator 1 with the input signal SI1. In other words, by increasing the intensity adjustment value CC, it is possible to increase the natural frequency of the fluctuation oscillator 1, to bring the natural frequency close to the frequency of the input signal SI1, and to synchronize the fluctuation oscillator 1 completely.

Here, the intensity adjustment value CC can be adjusted by adjusting the resistance value of the variable resistor constituting the intensity adjustment unit 16. Therefore, the operator can completely synchronize the fluctuation oscillator 1 with the input signal SI1 by simple work of adjusting the variable resistor.

Figure 12:
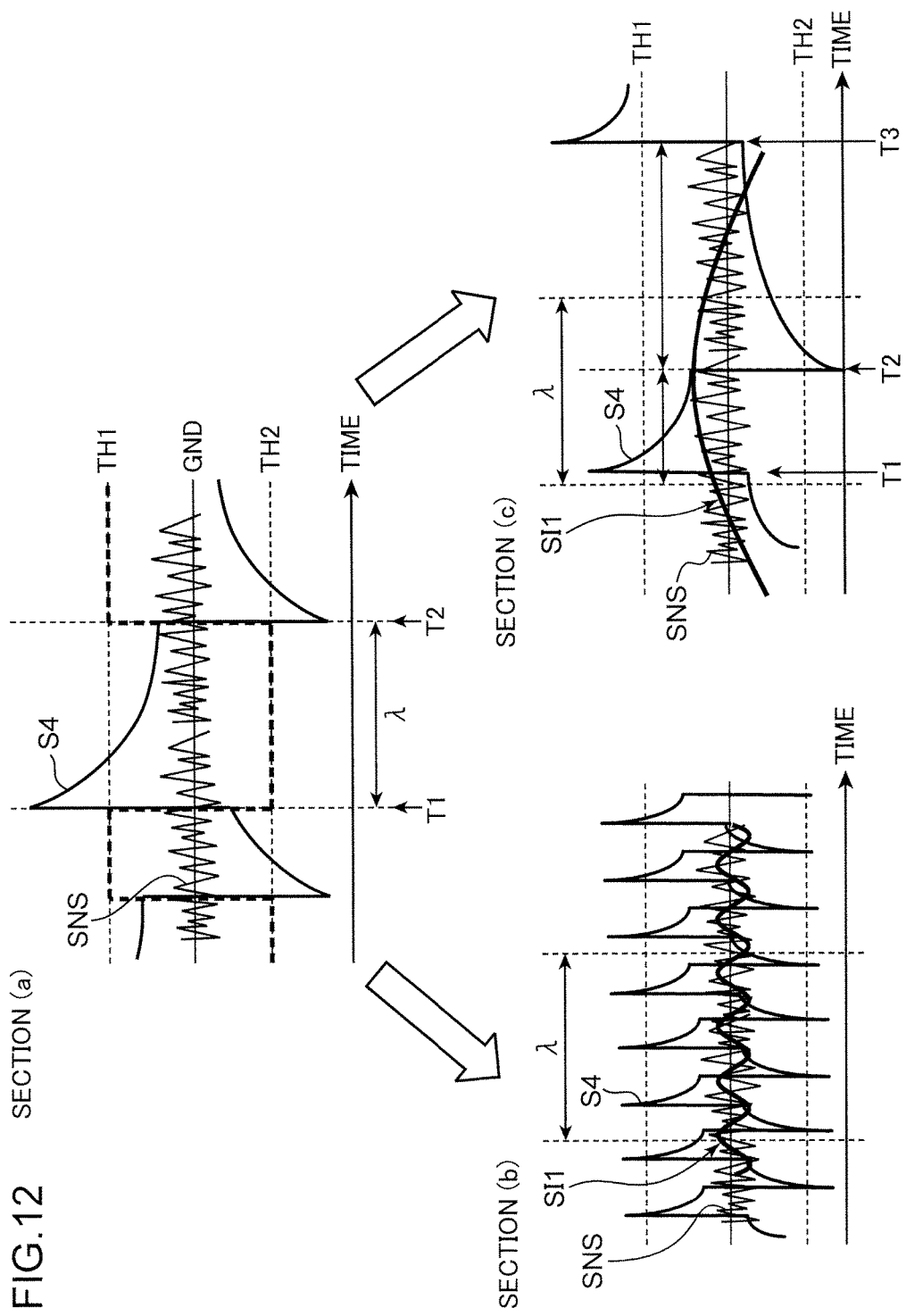
FIG. 12 is a waveform diagram describing behavior of the fluctuation oscillator according to a type of input signal.

FIG. 12 is a waveform diagram describing behavior of the fluctuation oscillator 1 according to a type of the input signal SI1. In FIG. 12, section (a) is a waveform diagram illustrating the behavior of the fluctuation oscillator 1 when only the noise signal SNS is input. Note that in FIG. 12, a differentiator is employed as the transient response unit 14. In a region where the feedback signal S4 is positive, the threshold is a threshold TH2, whereas in a region where the feedback signal S4 is negative, the threshold is a threshold TH1.

At a time T1, the addition signal S1 of the noise signal SNS and the feedback signal S4 exceeds the threshold TH1, and thus the feedback signal S4 is inverted to a positive side. At this time, the threshold for the transient response unit 14 is set at the negative side threshold TH2.

After the time T1, the feedback signal S4 is gradually attenuated in accordance with the time constant of the transient response unit 14. Then, at a time T2, the addition signal S1 of the noise signal SNS and the feedback signal S4 becomes lower than the threshold TH2, and thus the feedback signal S4 is inverted to a negative side. In this way, when only the noise signal SNS is input, the fluctuation oscillator 1 oscillates at a natural oscillation frequency prescribed by a natural oscillation width λ. As can be seen from section (a), the natural oscillation width λ depends on an attenuation factor of the feedback signal S4, and influence of the time constant of the transient response unit 14 is dominant.

Section (b) of FIG. 12 is a waveform diagram illustrating the behavior of the fluctuation oscillator 1 when the input signal SI1 having a frequency higher than the natural frequency is input.

When the frequency of the input signal SI1 is higher than the natural frequency, the input signal SI1 and the noise signal SNS cause stochastic resonance within the natural oscillation width λ. Thus, the feedback signal S4 can exceed the threshold mainly in accordance with the variation in the amplitude of the input signal SI1. Therefore, when the input signal SI1 having a frequency higher than the natural oscillation frequency is input, the fluctuation oscillator 1 is easily synchronized completely. As a result, the fluctuation oscillator 1 can be completely synchronized with the input signal SI1 even when the intensity of the input signal SI1 is equal to or less than the threshold.

Section (c) of FIG. 12 is a waveform diagram illustrating the behavior of the fluctuation oscillator 1 when the input signal SI1 having a frequency lower than the natural frequency is input. When the frequency of the input signal SI1 is lower than the natural frequency, the feedback signal S4 can exceed the threshold once with a high probability within the natural oscillation width λ. Therefore, at the time T1, the feedback signal S4 is inverted to a positive side.

After the time T1, the feedback signal S4 is attenuated, but since the input signal SI1 increases, the two signals weaken each other, and the noise signal SNS is dominant in the inversion of the feedback signal S4. At the time T2, the feedback signal S4 is inverted to a negative side at a timing shorter than the natural oscillation width λ.

After the time T2, the feedback signal S4 increases in accordance with the time constant of the transient response unit 14, but since the input signal SI1 decreases, the two signals weaken each other, and the noise signal SNS is dominant in the inversion of the feedback signal S4. At the time T3, the feedback signal S4 is inverted to a positive side at a timing longer than the natural oscillation width λ.

In this way, when the input signal SI1 having a frequency lower than the natural frequency is input, an inversion period of the feedback signal S4 is not aligned and the fluctuation oscillator 1 cannot be synchronized with the input signal SI1.

As described above, since the fluctuation oscillator 1 according to the first embodiment includes the intensity adjustment unit 16, it is easy to adjust the circuit parameters of the fluctuation oscillator 1 so as to detect the unknown weak input signal SI1.

Second Embodiment

Figure 13:
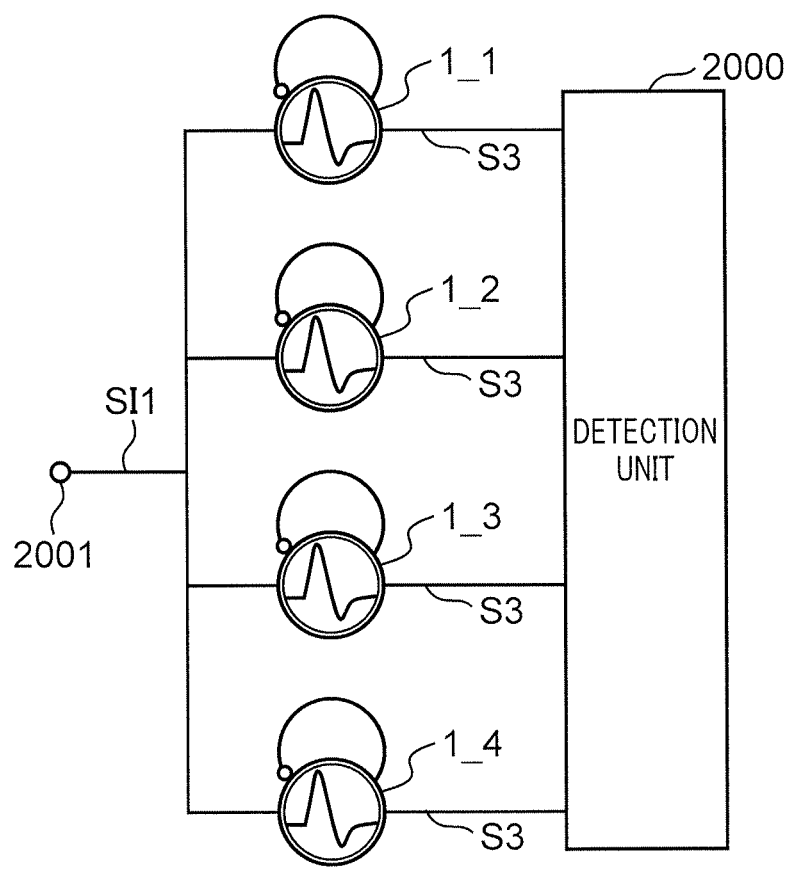
FIG. 13 is a diagram illustrating an overall configuration of a signal detection device according to a second embodiment of the present invention.

A second embodiment is characterized in that a signal detection device that detects an unknown input signal SI1 is configured by including a plurality of fluctuation oscillators 1. FIG. 13 is a diagram illustrating an overall configuration of a signal detection device 2. Note that in the present embodiment, components identical to components of the first embodiment are denoted with identical reference symbols, and descriptions thereof will be omitted.

The signal detection device 2 includes a plurality of fluctuation oscillators 1 and a detection unit 2000. In an example of FIG. 13, the fluctuation oscillators 1 include four fluctuation oscillators 1_1, 1_2, 1_3, and 1_4. However, this is one example, and the signal detection device 2 may include a plurality of fluctuation oscillators 1 other than four.

In the fluctuation oscillators 1_1 to 1_4, input terminals are connected to a common input terminal 2001, and a common input signal SI1 is input. Circuit parameters are adjusted such that the fluctuation oscillators 1_1 to 1_4 have different natural frequencies.

The detection unit 2000 is connected to output terminals of the fluctuation oscillators 1_1 to 1_4, and includes an information processing device such as a computer. Then, the detection unit 2000 receives output signals S3 of the respective fluctuation oscillators 1_1 to 1_4.

With reference to FIG. 7, in an incomplete synchronous region, a graph rises more quickly as a frequency of the input signal SI1 is closer to a natural frequency. That is, it is seen that a frequency shift amount Δf is larger as the frequency of the input signal SI1 is closer to the natural frequency.

Therefore, in the signal detection device 2 of FIG. 13, it can be estimated that when none of the fluctuation oscillators 1_1 to 1_4 is completely synchronized with the input signal SI1, the frequency of the input signal SI1 has a value closest to the natural frequency of the fluctuation oscillator 1 having the largest frequency shift amount Δf among the fluctuation oscillators 1_1 to 1_4.

For example, it is assumed that the natural frequencies of the fluctuation oscillators 1_1 to 1_4 are "5 Hz", "10 Hz", "15 Hz", and "20 Hz", respectively, and that an input signal SI1 having a frequency of "17 Hz" is input. In this case, in the fluctuation oscillators 1_1 to 1_3 with the natural frequencies lower than the frequency of the input signal SI1, the frequency shift amount Δf is observed. Furthermore, in this case, among the fluctuation oscillators 1_1 to 1_3, the frequency shift amount Δf of the fluctuation oscillator 1 having a natural frequency of "15 Hz" that is closest to the frequency of the input signal SI1 is the largest. Therefore, in the signal detection device 2 of FIG. 13, it can be estimated that when all of the fluctuation oscillators 1_1 to 1_4 are incompletely synchronized, the input signal SI1 has a frequency close to the natural frequency of the fluctuation oscillator 1 having the largest frequency shift amount Δf.

Meanwhile, with reference to FIG. 7, it is seen that when completely synchronized with the input signal SI1, the fluctuation oscillator 1 outputs the output signal S3 having the same frequency as the input signal SI1.

Therefore, in the signal detection device 2 of FIG. 13, it can be estimated that when the fluctuation oscillator 1 of any one of the fluctuation oscillators 1_1 to 1_4 is completely synchronized with the input signal SI1, the frequency of the input signal SI1 has the frequency of the output signal S3 of the completely synchronized fluctuation oscillator 1.

Figure 14:
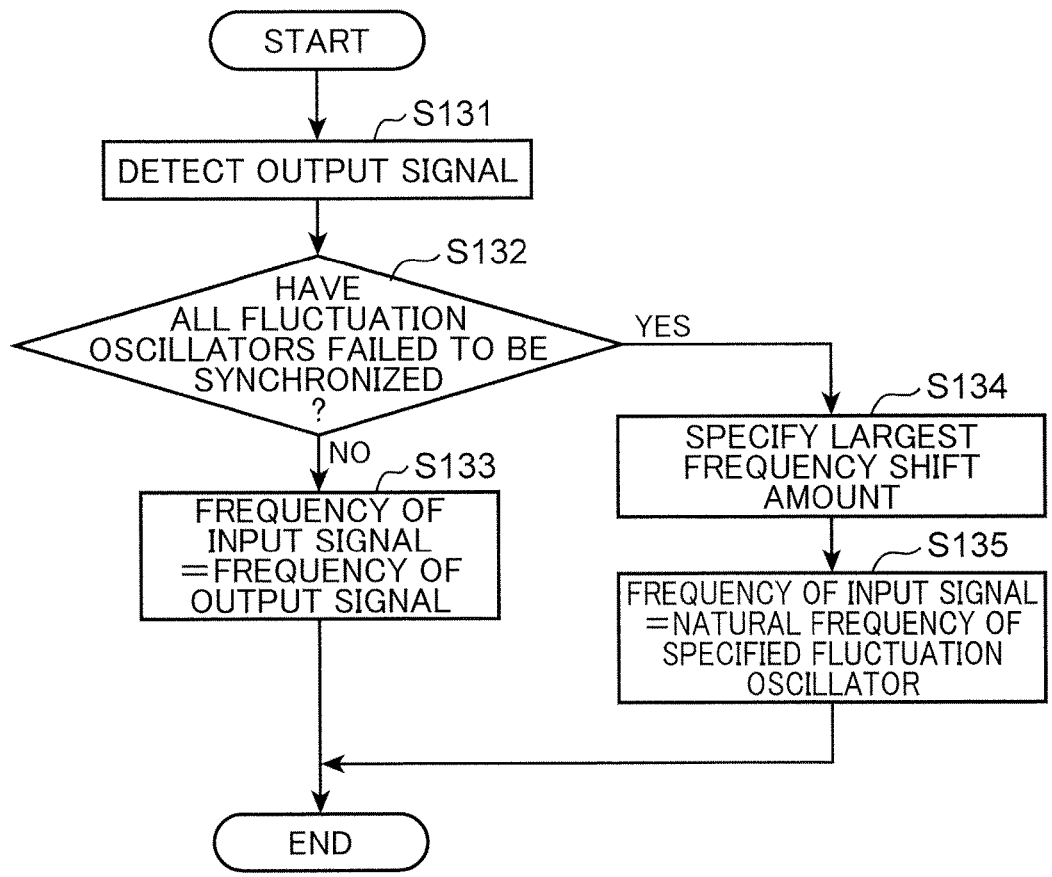
FIG. 14 is a flowchart illustrating a process when the signal detection device detects an input signal.

Therefore, the detection unit 2000 detects the input signal SI1 by logic illustrated in a flowchart of FIG. 14. FIG. 14 is a flowchart illustrating a process when the signal detection device 2 detects the input signal SI1.

First, the detection unit 2000 detects the output signal S3 from each fluctuation oscillator 1 (S131). Next, the detection unit 2000 determines whether all the fluctuation oscillators 1 have failed to be completely synchronized with the input signal SI1 (S132). When the detection unit 2000 determines that all the fluctuation oscillators 1 have failed to be completely synchronized with the input signal SI1 (YES in S132), the detection unit 2000 specifies the largest frequency shift amount Δf from among the frequency shift amounts Δf of the output signals S3 from the fluctuation oscillators 1 (S134). Next, the detection unit 2000 estimates the natural frequency of the fluctuation oscillator 1 having the largest frequency shift amount Δf as the frequency of the input signal SI1 (S135). Details of the specification of the frequency shift amount Δf are the same as in the first embodiment, and thus description thereof will be omitted.

On the other hand, when one of the fluctuation oscillators 1 is completely synchronized with the input signal SI1 (NO in S132), the frequency of the output signal S3 of the completely synchronized fluctuation oscillator 1 is estimated as the frequency of the input signal SI1 (S133).

As described above, since the signal detection device 2 of the second embodiment includes the plurality of fluctuation oscillators 1 having different natural frequencies, even when all the fluctuation oscillators 1 have failed to be completely synchronized with the input signal SI1, the frequency of the input signal SI1 can be estimated from the natural frequency of the fluctuation oscillator 1 having the largest frequency shift amount Δf. Also, with the signal detection device 2 of the second embodiment, when any one of the fluctuation oscillators 1 is completely synchronized with the input signal SI1, the frequency of the input signal SI1 can be estimated from the frequency of the output signal S3 of the fluctuation oscillator 1.

Third Embodiment

Figure 15:
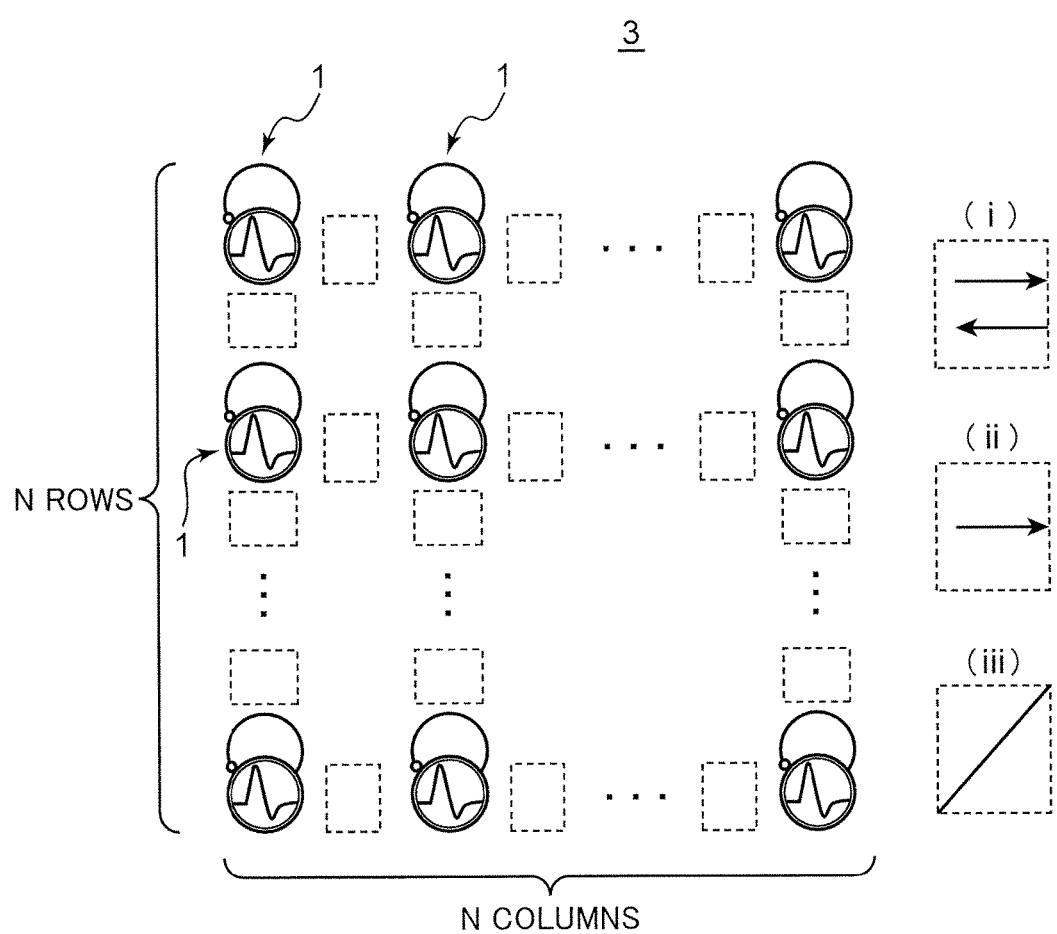
FIG. 15 is a diagram illustrating one example of a configuration of a display device in a third embodiment.

A third embodiment is characterized in that a display device is configured by including a plurality of fluctuation oscillators 1. FIG. 15 is a diagram illustrating one example of a configuration of a display device 3 in the third embodiment. As illustrated in FIG. 15, the display device 3 includes fluctuation oscillators 1 arranged in a matrix of N rows×N columns. Here, N is an integer equal to or greater than 1. Also, in the example of FIG. 15, the number of rows and the number of columns are set to be identical numbers, but may be set to be different numbers.

Dotted quadrangles indicated between adjacent fluctuation oscillators 1 indicate connection forms of the fluctuation oscillators 1. As illustrated on a right side of FIG. 15, the connection forms of the fluctuation oscillators 1 include (i) bidirectional coupling, (ii) unidirectional coupling, and (iii) non-coupling.

(i) The bidirectional coupling is a connection form in which, among two adjacent fluctuation oscillators 1, an output terminal of one fluctuation oscillator 1 is connected to an input terminal of the other fluctuation oscillator 1, and an output terminal of the other fluctuation oscillator 1 is connected to an input terminal of the one fluctuation oscillator 1.

(ii) The unidirectional coupling is a connection form in which, among two adjacent fluctuation oscillators 1, an output terminal of one fluctuation oscillator 1 is connected to an input terminal of the other fluctuation oscillator 1.

(iii) The non-coupling is a connection form in which two adjacent fluctuation oscillators 1 are not connected.

Note that in the third embodiment, a monitor unit 15 of each fluctuation oscillator 1 includes a light emitting device with light control changed in accordance with intensity of an output signal S3. As the light emitting device, any light emitting device may be employed as long as the light emitting device allows light control to be changed, such as an LED or a fluorescent lamp.

Figure 16:
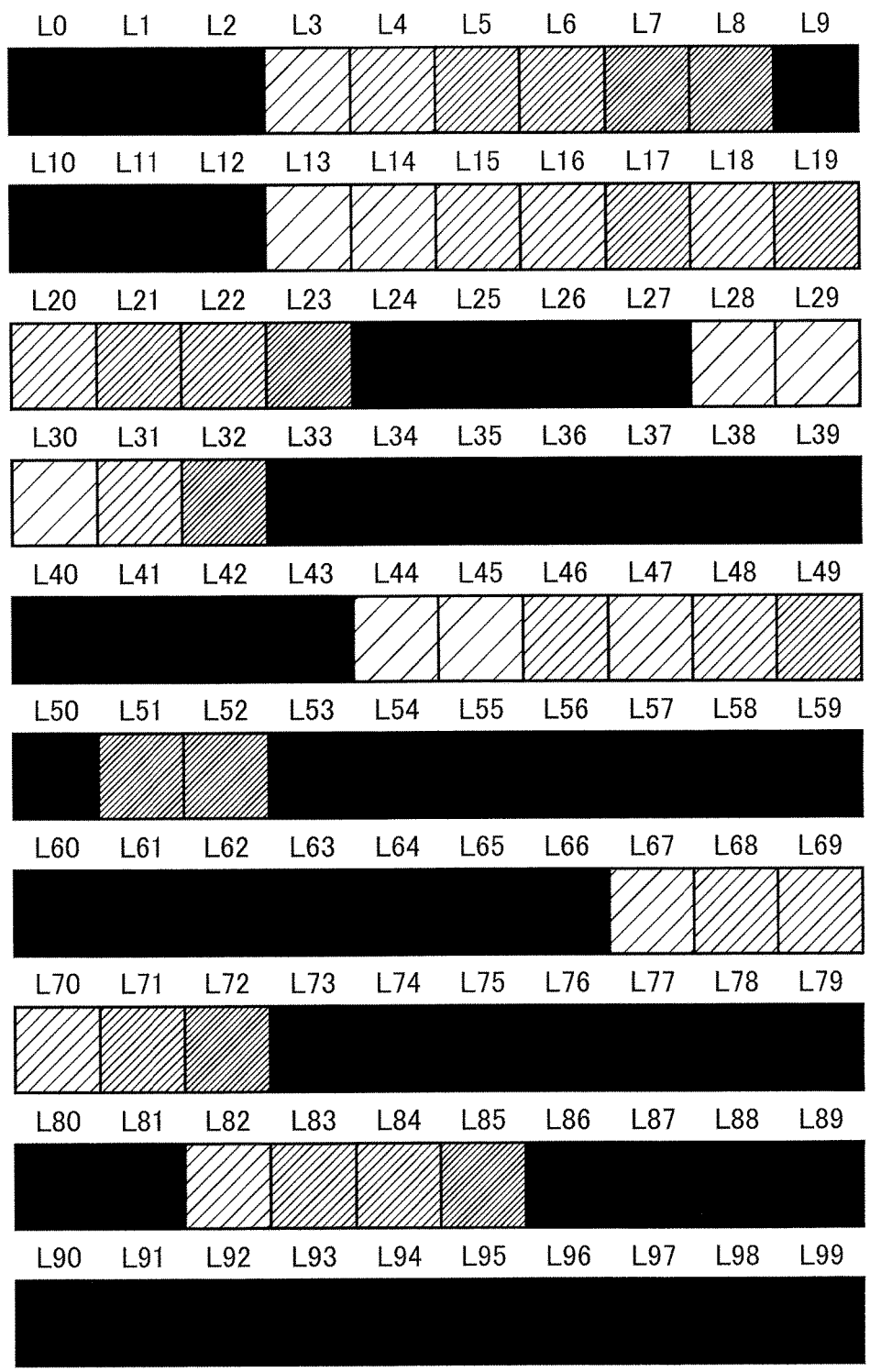
FIG. 16 is a diagram illustrating one example of a light emission pattern of the display device.

FIG. 16 is a diagram illustrating one example of a light emission pattern of the display device 3. In the example of FIG. 16, the display device 3 includes 100 fluctuation oscillators 1 arranged in 10 rows×10 columns indicated by L0 to L99. Moreover, each fluctuation oscillator 1 is unidirectionally coupled from the left side to the right side in the row direction, and the fluctuation oscillator 1 at the right end of a certain row is unidirectionally coupled to the fluctuation oscillator 1 at the left end of the next row. That is, in the example of FIG. 16, the fluctuation oscillator 1 at the right end of a certain row is regarded as adjacent to the fluctuation oscillator 1 at the left end of the next row.

In the display device 3 of FIG. 16, when a certain fluctuation oscillator 1 is ignited, the output signal S3 of the fluctuation oscillator 1 propagates sequentially to the adjacent fluctuation oscillator 1. For this reason, a light emission pattern is obtained in which brightness sequentially propagates toward the downstream fluctuation oscillator 1 with the ignited fluctuation oscillator 1 at a head. In the example of FIG. 16, the display device 3 emits light in a light emission pattern in which the fluctuation oscillators L3, L13, L28, and the like emit light brightly and light control becomes gradually dark from these fluctuation oscillators 1 toward the downstream fluctuation oscillators 1. Then, the display device 3 emits light such that this light emission pattern propagates chronologically toward the downstream fluctuation oscillators 1.

Here, since the fluctuation oscillator 1 has a frequency spectrum of 1/f fluctuation, the display device 3 can produce a light emission pattern that is comfortable for a human as if each fluctuation oscillator 1 seems to be autonomously emitting light. Taking fireflies as an example, the display device 3 can produce a light emission pattern in which, along with emission of a firefly, a firefly adjacent to the firefly emits light sequentially.

Note that in the example of FIG. 16, the fluctuation oscillators 1 are unidirectionally coupled, but may be bidirectionally coupled. In this case, a light emission pattern can be produced in which, when a certain fluctuation oscillator 1 is ignited, the output signal S3 gradually propagates to the fluctuation oscillators on both sides around this fluctuation oscillator 1. Also, in the example of FIG. 16, the fluctuation oscillators 1 are unidirectionally coupled, but the bidirectional coupling, the unidirectional coupling, and the non-coupling may be mixed.

Conclusion of Embodiments

A fluctuation oscillator according to one aspect of the present invention includes:
an adder configured to add a noise signal and a feedback signal to an input signal;
a threshold determination unit configured to generate a pulse signal by comparing an addition signal obtained through the addition with a threshold;
a transient response unit configured to cause transient response of the generated pulse signal to generate an output signal;
a feedback loop configured to feed back the output signal to the adder as the feedback signal; and
an intensity adjustment unit provided in the feedback loop and configured to adjust intensity of the feedback signal.

When one stochastic resonator in which input and output terminals are connected by the feedback loop constitute the fluctuation oscillator, unless the intensity of the feedback signal that is fed back to the adder via the feedback loop is properly adjusted, the fluctuation oscillator cannot detect a signal.

Although Patent Literature 1 discloses a form in which the feedback loop is formed between the input and output terminals and one stochastic resonator constitutes the fluctuation oscillator, a device for adjusting the intensity of the feedback signal is not provided on the feedback loop. Therefore, the conventional fluctuation oscillator has no option but to adjust the intensity of the feedback signal mainly by adjusting a time constant of a differentiator. If the time constant of a differentiator is adjusted, a waveform of the feedback signal can be changed, but since the intensity of the feedback signal cannot be increased or decreased as a whole, there is a problem that the adjustment takes time and effort.

In this configuration, the intensity adjustment unit for adjusting the intensity of the feedback signal is provided on the feedback loop. This makes it possible to adjust the intensity of the feedback signal, and to more flexibly adjust a circuit parameter. As a result, this configuration makes it easy to adjust the circuit parameter such that an unknown weak input signal can be detected.

In addition, in the aspect described above, a circuit parameter may be adjusted such that a natural frequency is lower than a frequency of the input signal.

The fluctuation oscillator that feeds back the output signal to the input signal has characteristics in which, when the input signal with a frequency higher than the natural frequency is input, a frequency shift amount (shift amount of the frequency of the output signal with respect to the natural frequency) can be observed, but when the input signal with a frequency lower than the natural frequency is input, the frequency shift amount cannot be observed. In this configuration, since the circuit parameter is adjusted such that the natural frequency of the fluctuation oscillator is lower than the frequency of the input signal to be detected, the fluctuation oscillator can detect the input signal. In addition, when the input signal with a frequency lower than the natural frequency is input, the fluctuation oscillator cannot detect the input signal. Therefore, the fluctuation oscillator can have a function of a high-pass filter.

Furthermore, when the natural frequency of the fluctuation oscillator is lower than the frequency of the input signal, the fluctuation oscillator can oscillate in synchronization with the input signal even if the intensity of the input signal is equal to or less than the threshold. Therefore, the fluctuation oscillator can detect the frequency of a weak input signal from the frequency of the output signal.

In addition, in the aspect described above, the fluctuation oscillator may further include a monitor unit that monitors the output signal.

With this configuration, since the monitor unit that monitors a transient response signal is provided, it is easy to detect the input signal.

In addition, in the aspect described above, when the fluctuation oscillator is completely synchronized with the input signal, the monitor unit may determine that the input signal having a frequency of the output signal is input, and unless the fluctuation oscillator is completely synchronized with the input signal, when a frequency shift amount of the output signal with respect to the natural frequency of the fluctuation oscillator is observed, the monitor unit may determine that the input signal is detected.

With this configuration, when the fluctuation oscillator is completely synchronized with the input signal, the frequency of the input signal can be detected from the frequency of the output signal, and when the fluctuation oscillator is not completely synchronized with the input signal, the input signal can be detected from the presence or absence of observation of the frequency shift amount.

In addition, in the aspect described above, the monitor unit may include a light emitting device that undergoes light control in accordance with intensity of the output signal.

With this configuration, since the monitor unit includes the light emitting device that undergoes light control in accordance with the intensity of the output signal, the monitor unit can cause the light emitting device to emit light in a light emission pattern according to an oscillation pattern of the fluctuation oscillator. Here, since the fluctuation oscillator superimposes the noise signal on the input signal, a power spectrum has characteristics of 1/f fluctuation. Therefore, the monitor unit can cause the light emitting device to emit light in a 1/f fluctuation light emission pattern, and can cause the light emitting device to emit light in a light emission pattern that is comfortable for a human.

In addition, in the aspect described above, the transient response unit may include an integrator.

With this configuration, since the transient response unit includes an integrator, it is possible to smoothly change the output signal. In particular, when an aspect in which the light emitting device emits light in accordance with the oscillation pattern of the fluctuation oscillator is employed, the light emitting device can emit light in a smooth emission pattern.

A signal detection device according to another aspect of the present invention includes a plurality of the fluctuation oscillators,
    each of the fluctuation oscillators has a different natural frequency, and a common input signal is input, and
    the signal detection device includes a detection unit configured to detect a frequency of the input signal based on an output signal from each of the fluctuation oscillators.

The fluctuation oscillator has characteristics that, when the frequency of the input signal is higher than the natural frequency, the frequency shift amount increases as the frequency of the input signal is closer to the natural frequency. Therefore, it can be estimated that the frequency of the input signal is close to the natural frequency of the fluctuation oscillator having the largest frequency shift amount. With this configuration, since the plurality of fluctuation oscillators having different natural frequencies is provided, the frequency of an unknown input signal can be detected using the natural frequency of the fluctuation oscillator in which the largest frequency shift amount is observed.

In the aspect described above, when at least one of the fluctuation oscillators is completely synchronized with the input signal, the detection unit may estimate the natural frequency of the output signal of the completely synchronized fluctuation oscillator as the frequency of the input signal.

The fluctuation oscillator has characteristics that, when the fluctuation oscillator is completely synchronized with the input signal, the output signal oscillates at the same frequency as the input signal. With this configuration, among the plurality of fluctuation oscillators, when at least one fluctuation oscillator is completely synchronized with the input signal, it is estimated that the input signal has the frequency of the output signal of the fluctuation oscillator. Therefore, the frequency of the unknown input signal can be accurately detected.

In the aspect described above, when all of the fluctuation oscillators have failed to be completely synchronized with the input signal, the detection unit may estimate the frequency of the input signal based on the natural frequency of each of the fluctuation oscillators having the largest frequency shift amount among all of the fluctuation oscillators.

With this configuration, when all of the fluctuation oscillators have failed to be completely synchronized with the input signal, the frequency of the input signal can be accurately detected based on the natural frequency of the fluctuation oscillator having the largest frequency shift amount.

A display device according to still another aspect of the present invention is a display device including a plurality of the fluctuation oscillators arranged in a matrix,
    each of the fluctuation oscillators includes a light emitting device with light control changed in accordance with the output signal, and
    each of the fluctuation oscillators is connected to at least one fluctuation oscillator of the adjacent fluctuation oscillators.

With this configuration, since the plurality of fluctuation oscillators each having a light emitting device with light control changed in accordance with the output signal is arranged in a matrix, when a certain fluctuation oscillator is ignited, it is possible to cause the fluctuation oscillator to emit light in an emission pattern in which the output signal of the fluctuation oscillator gradually propagates to surrounding fluctuation oscillators.

In the aspect described above, each fluctuation oscillator may be bidirectionally or unidirectionally connected to at least one fluctuation oscillator among adjacent fluctuation oscillators.

With this configuration, by bidirectionally coupling adjacent fluctuation oscillators, it is possible to cause the ignited fluctuation oscillator to emit light in a light emission pattern in which the output signal propagates bidirectionally around the fluctuation oscillator. In addition, by unidirectionally coupling adjacent fluctuation oscillators, it is possible to cause the ignited fluctuation oscillator to emit light in a light emission pattern in which the output signal propagates unidirectionally around the fluctuation oscillator.

The invention claimed is:

1. A fluctuation oscillator comprising:
   an adder configured to add a noise signal and a feedback signal to an input signal;
   a threshold determination unit configured to generate a pulse signal by comparing an addition signal obtained through the addition with a threshold;
   a transient response unit configured to cause transient response of the generated pulse signal to generate an output signal;
   a feedback loop configured to feed back the output signal to the adder as the feedback signal; and
   an intensity adjustment unit provided in the feedback loop and configured to adjust intensity of the feedback signal.

2. The fluctuation oscillator according to claim 1, wherein a circuit parameter is adjusted such that a natural frequency is lower than a frequency of the input signal.

3. The fluctuation oscillator according to claim 1, further comprising a monitor unit configured to monitor the output signal.

4. The fluctuation oscillator according to claim 3, wherein when the fluctuation oscillator is completely synchronized with the input signal, the monitor unit determines that the input signal having a frequency of the output signal is input, and unless the fluctuation oscillator is completely synchronized with the input signal, when a frequency shift amount of the output signal with respect to the natural frequency of the fluctuation oscillator is observed, the monitor unit determines that the input signal is detected.

5. The fluctuation oscillator according to claim 3, wherein the monitor unit includes a light emitting device that undergoes light control in accordance with intensity of the output signal.

6. The fluctuation oscillator according to claim 1, wherein the transient response unit includes an integrator.

7. A signal detection device comprising a plurality of the fluctuation oscillators according to claim 1, wherein
   each of the fluctuation oscillators has a different natural frequency, and a common input signal is input, and
   the signal detection device comprises a detection unit configured to detect a frequency of the input signal based on an output signal from each of the fluctuation oscillators.

8. The signal detection device according to claim 7, wherein when at least one of the fluctuation oscillators is completely synchronized with the input signal, the detection unit estimates the natural frequency of the output signal of the completely synchronized fluctuation oscillator as the frequency of the input signal.

9. The signal detection device according to claim 7, wherein when all of the fluctuation oscillators have failed to be completely synchronized with the input signal, the detection unit estimates the frequency of the input signal based on the natural frequency of each of the fluctuation oscillators having the largest frequency shift amount among all of the fluctuation oscillators.

10. A display device comprising a plurality of the fluctuation oscillators according to claim 1 arranged in a matrix, wherein
    each of the fluctuation oscillators includes a light emitting device with light control changed in accordance with the output signal, and
    each of the fluctuation oscillators is connected to at least one fluctuation oscillator of adjacent fluctuation oscillators.

* * * * *